United States Patent
Noto et al.

(10) Patent No.: US 6,847,056 B2
(45) Date of Patent: Jan. 25, 2005

(54) LIGHT EMITTING DEVICE

(75) Inventors: Nobuhiko Noto, Annaka (JP); Masato Yamada, Annaka (JP); Masahisa Endo, Annaka (JP); Hitoshi Ikeda, Annaka (JP); Shinji Nozaki, Kawasaki (JP); Kazuo Uchida, Tokyo (JP); Hiroshi Morisaki, Tsurugashima (JP)

(73) Assignees: Shin-Etsu Handotai Co., Ltd., Tokyo (JP); Nanoteco Corporation, Tokyo (JP)

( * ) Notice: Subject to any disclaimer, the term of this patent is extended or adjusted under 35 U.S.C. 154(b) by 30 days.

(21) Appl. No.: 10/240,101

(22) PCT Filed: Jan. 29, 2002

(86) PCT No.: PCT/JP02/00633

§ 371 (c)(1),
(2), (4) Date: Dec. 26, 2002

(87) PCT Pub. No.: WO02/061855

PCT Pub. Date: Aug. 8, 2002

(65) Prior Publication Data

US 2004/0061101 A1 Apr. 1, 2004

(30) Foreign Application Priority Data

Jan. 31, 2001 (JP) .......................... 2001-024946

(51) Int. Cl.7 ............................................. H01L 33/00
(52) U.S. Cl. ............................................ 257/98; 257/99
(58) Field of Search ....................................... 257/98, 99

(56) References Cited

U.S. PATENT DOCUMENTS

| | | | | |
|---|---|---|---|---|
| 6,057,562 A | * | 5/2000 | Lee et al. ..................... | 257/96 |
| 6,420,732 B1 | * | 7/2002 | Kung et al. ................... | 257/79 |
| 6,459,098 B1 | * | 10/2002 | Chen et al. .................... | 257/79 |

FOREIGN PATENT DOCUMENTS

| JP | 5190893 | 7/1993 |
|---|---|---|
| JP | 7066455 | 3/1995 |
| JP | 8-78730 | 3/1996 |
| JP | 2000-58909 | 2/2000 |
| JP | 2001-7388 | 1/2001 |
| JP | 2001-85741 | 3/2001 |
| JP | 11-307810 | 2/2002 |

* cited by examiner

*Primary Examiner*—Jerome Jackson
(74) *Attorney, Agent, or Firm*—Snider & Associates; Ronald R. Snider

(57) ABSTRACT

A light emitting device 100 has a structure in which a p type InGaAs layer 7 as an electrode contact layer and an ITO electrode layer 8 as an oxide transparent electrode layer are formed in the order in a first major surface 17 side of a light emitting layer section 24. In a second major surface 18 side of the light emitting layer section 24, an n type InGaAs layer 9 as an electrode contact layer and an ITO electrode layer 10 as an oxide transparent electrode layer are formed in the order. The ITO electrode layers 8 and 10 together with the p type InGaAs layer 7 and the n type InGaAs layer 9 are formed on the respective both major surfaces 17 and 18 of the light emitting layer section 24 so as to cover the respective both major surfaces 17 and 18 in the entirety thereof.

15 Claims, 7 Drawing Sheets

LIGHT EMITTING DEVICE

FIELD OF THE INVENTION

The present invention relates to a light emitting device.

DESCRIPTION OF THE BACKGROUND ART

A light emitting device having a light emitting layer section made of $(Al_xGa_{1-x})_yIn_{1-y}P$ alloy, wherein $0 \leq x \leq 1$, $0 \leq y \leq 1$ (hereinafter also referred to as AlGaInP alloy or simply AlGaInP) adopts a double hetero-structure in which a thin AlGaInP active layer is sandwiched between an n type AlGaInP cladding layer and a p type AlGaInP cladding layer, each with a larger bandgap than the active layer, thereby enabling a high brightness device to be realized. In recent years, a blue light emitting device having a similar double hetero-structure made of $In_xGa_yAl_{1-x-y}N$, wherein $0 \leq x \leq 1$, $0 \leq y \leq 1$ and $x+y \leq 1$, has been put into practical use.

Figure 7A:
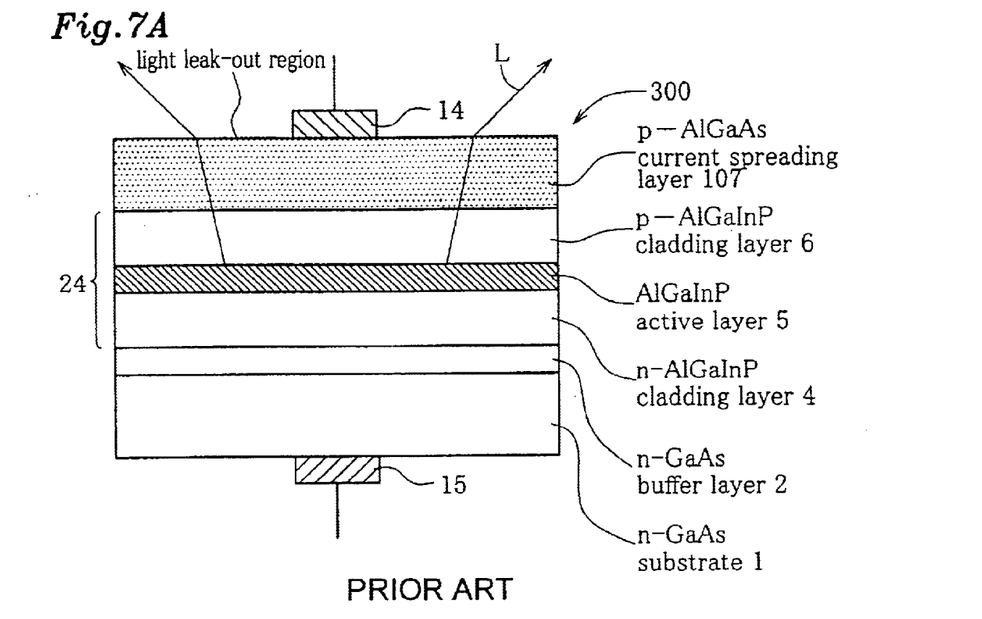
FIG. 7A is a descriptive diagram showing a structure of a prior art light emitting device and its problem.

FIG. 7A is an example of an AlGaInP light emitting device and in the device 300, a hetero-epitaxial growth is performed on an n type GaAs substrate 1: an n type GaAs buffer layer 2, an n type AlGaInP cladding layer 4, an AlGaInP active layer 5 and a p type AlGaInP cladding layer 6 are stacked in the order to form a light emitting layer section 24 of a double hetero-structure. Numeral symbols 14 and 15 are metal electrodes for applying a drive voltage thereto. Herein, since the metal electrode 14 works as a light interceptor, it is formed, for example, in a way to cover only a central portion of a major surface of the light emitting layer section to thereby extract light from an electrode non-formation area around the electrode 14.

In this case, since an area of a light extraction region formed around the electrode 14 can be increased with reduction in area of the metal electrode 14, a smaller area of the metal electrode 14 is advantageous from the viewpoint of improvement on light extraction efficiency. While an attempt was conducted in the prior art in which a current is effectively spread within a device by an contrivance of a shape of the electrode to thereby increase a light extraction quantity, increase in area of the electrode, in this case as well, was unavoidable one way or another, having leading to a dilemma, to the contrary, in which a light extraction quantity is limited low due to reduction in area of light extraction. Furthermore, a dopant concentration in and, in turn, a conductivity of the cladding layer 6 is restricted to a somewhat low value in order to optimize radiative recombination of carriers in the active layer 5 to thereby produce a tendency of a current being hard to spread laterally. This leads to a phenomenon that a current is concentrated in the electrode covering area to reduce an effective light extraction quantity in the light extraction area. Therefore, a method has been adopted in which a current spreading layer 107 having low resistivity with an increased dopant concentration is formed between the cladding layer 6 and the electrode 14. In a prior practice, as a material of such a current spreading layer 107, there was used, for example an AlGaAs alloy.

Figure 7B:
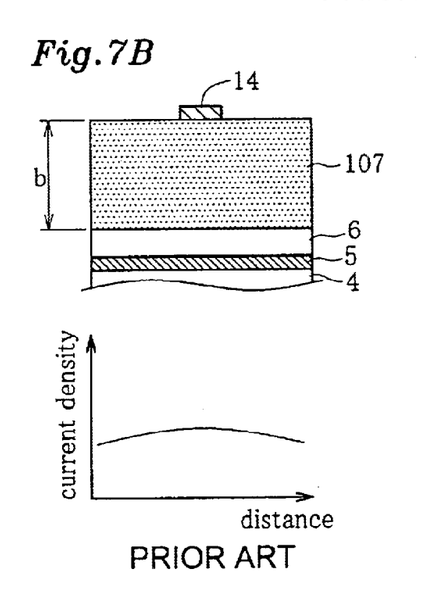
FIG. 7B is another descriptive diagram showing a structure of a prior art light emitting device and its problem.
Figure 7C:
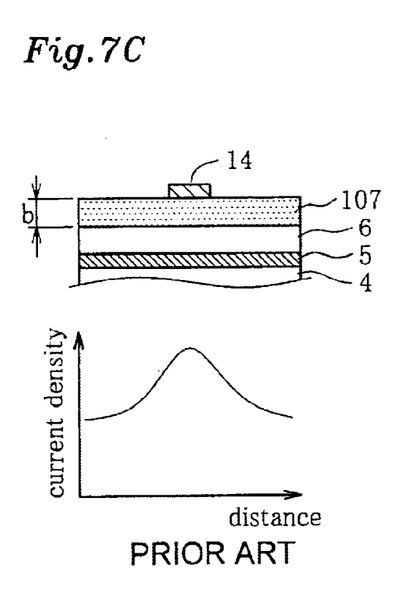
FIG. 7C is still another descriptive diagram showing a structure of a prior art light emitting device and its problem.

While, since the current spreading layer 107 made of an AlGaAs alloy is lattice-matched with an AlGaInP alloy, both layers advantageously can be consecutively grown as a high quality semiconductor layer in a growth furnace, its thickness b, as shown in FIG. 7B, has to be set to a considerably thick value of the order of 50 μm. With such a method adopted, since not only is a time required for film formation longer, but much of raw material also becomes necessary, a productivity is conspicuously reduced to suffer a high cost, having resulted in a great problem in industrial applicability. What's worse, a distance between a surface of the device and the active layer 5, from which light is actually emitted, becomes excessively large to increase series resistance, thereby having produced inconveniences of not only reducing a luminous efficiency, but also degrading a performance in high frequency operation. On the other hand, as shown in FIG. 7C, with decrease in thickness b of the current spreading layer 107, a dilemma arises that the layer becomes short of a current spreading effect to the contrary to reduce an effective light extraction quantity in the light extraction area.

Therefore, a proposal has been made that the entire surface of the current spreading layer 107 made of an AlGaAs alloy is covered with a transparent conductive layer made of ITO (Indium Tin Oxide) with a high conductivity to thereby not only reduce a thickness b of the current spreading layer 107, but achieve a sufficient current spreading effect, with the result of a higher light extraction efficiency acquired.

According to a study conducted by the inventors of the present invention, however, it has been found that in a case where a transparent conductive layer made of ITO is formed on the current spreading layer 107 made of an AlGaAs alloy, a contact resistance between the transparent conductive layer and the current spreading layer 107 becomes high with ease, leading to a state that reduction in a luminous efficiency due to increase in series resistance is hard to be avoided.

It is an object of the present invention to provide a light emitting device capable of improving a light extraction efficiency by adopting not only an oxide transparent electrode layer as an electrode for emission driving, but also a device structure enabling contact resistance of the electrode to decrease.

DISCLOSURE OF THE INVENTION

In order to achieve the above object, a first construction of a light emitting device of the present invention is a light emitting device including: a light emitting layer section made of compound semiconductor layers; and an oxide transparent electrode layer for applying an emission drive voltage to the light emitting layer section, wherein light from the light emitting layer section is extracted in a way to be transmitted through the oxide transparent electrode layer, wherein an electrode contact layer made of a compound semiconductor containing no Al and with a bandgap energy less than 1.42 eV is formed between the light emitting layer section and the oxide transparent electrode layer so as to be in contact with the oxide transparent electrode layer.

According to the above construction, a current can be effectively spread over the entire surface of the light emitting device with the oxide transparent electrode layer but without a current spreading layer, thereby increasing a light emission quantity. Furthermore, a region covered by a light intercepting metal electrode can be designed to the minimum area for bonding wires, thereby enabling increase in a light extraction area as compared with a prior art structure of a light emitting device in which a size of an electrode is designed large in order to effectively spread a current laterally in the light emitting device. Moreover, an electrode contact layer made of a compound semiconductor containing no Al and with a bandgap energy less than 1.42 eV is formed between the light emitting layer section and the oxide transparent electrode layer so as to be in contact with the oxide transparent electrode layer, thereby enabling contact resistance of the oxide transparent electrode to be greatly reduced and, therefore, enabling a light extraction efficiency to be enhanced.

The inventors of the present invention considers the following two reasons for reduction in contact resistance of the oxide transparent electrode layer by adoption of the electrode contact layer as described above.

(1) While, in a prior art light emitting device, an oxide transparent electrode layer was formed so as to be in contact with an AlGaAs current spreading layer, an AlAs alloy composition has to be considerably raised in order to sufficiently ensure a transmissibility in a current spreading layer. Since an AlGaAs alloy of a high AlAs composition contains Al at a high concentration, it is very easy to be oxidized and when the oxide transparent electrode layer is formed, oxygen contained in the layer bonds with an Al component in the AlGaAs current spreading layer to form a high resistivity oxide layer.

(2) Since an AlGaAs alloy of a high AlAs composition has a high bandgap energy in the range of from 2.02 to 2.13 eV in a case of the AlGaAs alloy of an ordinary use in the current spreading layer, naturally though the bandgap energy changes according to an alloy composition thereof, an ohmic contact or a contact with a low resistance close to the ohmic contact (for example, $10^{-4}$ $\Omega \cdot cm$ or less, both cases are collectively hereinafter referred to as an ohmic contact) is hard to be formed between the current spreading layer and an oxide transparent electrode layer. Furthermore, in a case where an oxide transparent electrode layer is formed on an AlGaInP cladding layer so as to be in direct contact with the AlGaInP cladding layer without AlGaAs as well, a problem similar to the case of the above AlGaAs arises since a bandgap energy is as high as from 2.3 to 2.35 eV and Al is contained.

According to the light emitting device of the first construction of the present invention, since an electrode contact layer in contact with an oxide transparent electrode contains no Al, a high resistivity oxide layer is hard to be formed and has a small bandgap energy (less than 1.42 eV and in a case where, for example, $In_{0.5}Ga_{0.5}As$ is adopted, a bandgap thereof is 0.75 eV); which enables an ohmic contact to be realized with ease. As a result, a contact resistance of the transparent electrode layer can be greatly reduced.

A second construction of a light emitting device of the present invention is a light emitting device including: a light emitting layer section made of compound semiconductor layers; and an oxide transparent electrode layer for applying an emission drive voltage to the light emitting layer section, wherein light from the light emitting layer section is extracted in a way to be transmitted through the oxide transparent electrode layer, wherein an electrode contact layer made of $In_xGa_{1-x}As$ ($0<x\leq 1$) is formed between the light emitting layer section and the oxide transparent electrode layer so as to be in contact with the oxide transparent electrode layer. Since the construction adopts the oxide transparent electrode layer, a light extraction area can be increased like the first construction. Furthermore, by forming the electrode contact layer made of $In_xGa_{1-x}As$ between the light emitting layer section and the oxide transparent electrode layer, a contact resistance of the oxide transparent electrode layer can be greatly reduced, thereby, enabling a light extraction efficiency to be drastically enhanced.

Figure 9:
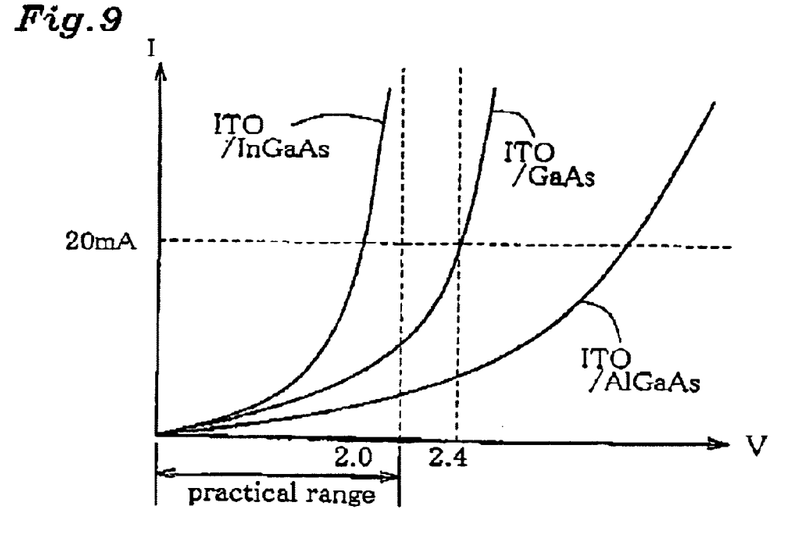
FIG. 9 is a graph of I-V characteristics showing respective VF values in cases where various kinds of electrode contact layers are provided between AlGaInP and an ITO electrode layer.

FIG. 9 shows current vs. voltage characteristics in the respective following light emitting devices:

(1) a light emitting device with an ITO transparent electrode layer formed directly on an AlGaAs layer or an AlGaInP layer, (2) a light emitting device with an ITO transparent electrode layer formed on an AlGaAs layer with a GaAs layer (with a bandgap of 1.42 eV) interposed therebetween and (3) a light emitting device of the present invention with an ITO transparent electrode layer on the light emitting layer section with an $In_{0.5}Ga_{0.5}As$ electrode contact layer interposed therebetween. While, in the case (2) where the GaAs layer is in contact with the ITO transparent electrode layer, a VF value (a value of a voltage necessary for causing a current with a specific value to flow) is lower as compared with the case (1) because of reduction in a series resistance component, the VF value is still rather high more or less. In contrast thereto, in the case (3) (the present invention) where the InGaAs layer with a bandgap energy less than GaAs is adopted, a reduction in VF is more conspicuous, and it is understood that the value reaches a practical level.

In the first and second constructions of a light emitting device of the present invention, as a material of the oxide transparent electrode layer, there can be used a material containing tin oxide ($SnO_2$) or Indium oxide ($In_2O_3$) as a main component. To be concrete, as a material of the oxide transparent electrode layer, ITO is of a high conductivity and can be preferably used in the present invention. ITO is an Indium oxide film doped with tin oxide and a resistivity of the electrode layer can be a sufficiently low value of $5 \times 10^{-4}$ $\Omega \cdot cm$ or less by adjusting a content of tin oxide in the electrode layer to a value in the range of from 1 to 9 mass %. Note that, in addition to an ITO electrode layer, a ZnO electrode layer is of a high conductivity, which can be adopted in the present invention. Furthermore, as materials of an oxide transparent electrode layer, the following oxides can be used: tin oxide doped with antimony oxide (so-called NESA), $Cd_2SnO_4$, $Zn_2SnO_4$, $ZnSnO_3$, $MgIn_2O_4$ and $CdSb_2O_6$ doped with yttrium oxide (Y), $GaInO_3$ doped with tin oxide and others.

The oxide transparent electrode layer can be formed by means of a known vapor phase film formation method, for example, a chemical vapor deposition (CVD) method, a physical vapor deposition (PVD) method such as sputtering or vacuum evaporation, or a molecular beam epitaxy (MBE) method. An ITO electrode layer and a ZnO electrode layer can be formed by means of radio frequency sputtering or vacuum evaporation and a NESA film can be formed by means of a CVD method. The oxide transparent electrode layer may be formed using a sol-gel method or the like instead of the above vapor phase growth method.

An oxide transparent electrode layer can be formed so as to cover all the surface of a light emitting layer section. With such a structure, the oxide transparent electrode layer can play a role as a current spreading layer, which results in no necessity for formation of a thick current spreading layer made of a compound semiconductor as was used in a prior art practice, or which, if a current spreading layer is formed, enables a thickness of the current spreading layer to be greatly reduced, thus contributing to reduction in cost due to simplification in process with the result of great effectiveness in industrial applicability. On the other hand, a thickness of an electrode contact layer is not required so much as long as the thickness is on the order of a value necessary and sufficient for achieving an ohmic contact, and to be concrete, the thickness is only required to be a certain value at which a compound semiconductor as a material of an electrode contact layer does not show a bandgap energy different from a bulk crystal and, for example, in a case where $In_xGa_{1-x}As$ is used, a thickness of the order of at least 0.001 $\mu m$ is sufficient. Therefore, an interlayer distance between an oxide transparent electrode layer and a light emitting layer section can be greatly reduced as compared with a prior art light emitting device, while enabling minimization of an effect of reducing series resistance due to reduction in the interlayer distance. Note that with excessive increase in thickness of an electrode contact layer made of $In_xGa_{1-x}As$, light absorption in the electrode contact layer increases and as a result, a light extraction efficiency decreases; therefore a thickness of an electrode contact layer is desirably 0.02 μm or less.

Since a light emitting layer section made of $(Al_xGa_{1-x})_yIn_{1-y}P$, wherein $0 \leq x \leq 1$, $0 \leq y \leq 1$, or $In_xGa_yAl_{1-x-y}N$, wherein $0 \leq x \leq 1$, $0 \leq y \leq 1$ and $x+y \leq 1$, contains Al in almost any case, a problem of degradation due to oxidation has to be considered, but adoption of a structure to cover all the surface of an oxide transparent electrode layer is advantageous in that the oxide transparent electrode layer can be caused to work as a passivation film to the light emitting layer section containing the Al.

Note that while $In_xGa_{1-x}As$ is a compound semiconductor a difference in lattice constant between which and a compound semiconductor as a material of the light emitting layer section (or GaAs) increases more or less according to an alloy composition of $In_xGa_{1-x}As$, an influence of lattice mismatching can be kept comparatively small in a case where an $In_xGa_{1-x}As$ film is formed as a thin film to be on the order of a value in the range of from 0.001 to 0.02 μm, thereby enabling formation of an electrode contact layer using $In_xGa_{1-x}As$.

Note that in a case where an electrode contact layer in direct contact with an oxide transparent electrode layer is formed using a compound semiconductor layer, it is desirable as described above to use a compound semiconductor less than 1.42 eV in bandgap energy from the viewpoint of forming a good ohmic contact with the transparent electrode layer. In addition, with an alleviated influence of lattice mismatching due to thinning of a layer thickness, the following compounds can be used in addition to InGaAs: InP, InAs, GaSb, InSb or an alloy thereof.

A light emitting layer section made of $(Al_xGa_{1-x})_yIn_{1-y}P$ or $In_xGa_yAl_{1-x-y}N$ can be made as a double hetero-structure obtained by stacking a first conductivity type cladding layer, an active layer and a second conductivity type cladding layer in the order, made of $(Al_xGa_{1-x})_yIn_{1-y}P$ or $In_xGa_yAl_{1-x-y}N$. Since injected holes and electrons are confined within a narrow active layer by energy barriers caused by a difference in bandgap between the active layer and each of cladding layers formed on both sides thereof to be efficiently recombined, a very high luminous efficiency can be realized. Furthermore, by composition adjustment of an active layer, in a case of the former compound semiconductor, an emission wavelength can be realized in a wide range from a green to red region in color (or in the range of from 520 nm to 670 nm, both limits included, in peak emission wavelength), while in a case of the latter compound semiconductor, an emission wavelength can be realized in a wide range from an ultraviolet to red region in color (or in the range of from 300 nm to 700 nm, both limits included, in peak emission wavelength).

In the above structure, the electrode contact layer can be formed between at least one of the first conductivity type cladding layer and the second conductivity type cladding layer and the oxide transparent electrode layer so as to be in contact with the oxide transparent electrode layer. For example, in a case where a major surface at only one side of a light emitting layer section of a double hetero-structure is used as a light extraction surface, the oxide transparent electrode layer can be formed by forming the electrode contact layer between the cladding layer in the only one side and the oxide transparent electrode layer in contact with the oxide transparent electrode. On the other hand, in a case where major surfaces at both sides of the light emitting layer section are used as light extraction surfaces, not only can oxide transparent electrodes be formed correspondingly above respective both cladding layers, but electrode contact layers in contact the respective oxide transparent electrodes canal so be formed between the corresponding oxide transparent electrodes and the corresponding cladding layers.

BEST MODE FOR CARRYING OUT THE INVENTION

Description will be given of the best mode for carrying out of the present invention below with reference to the accompanying drawings.

Figure 1:
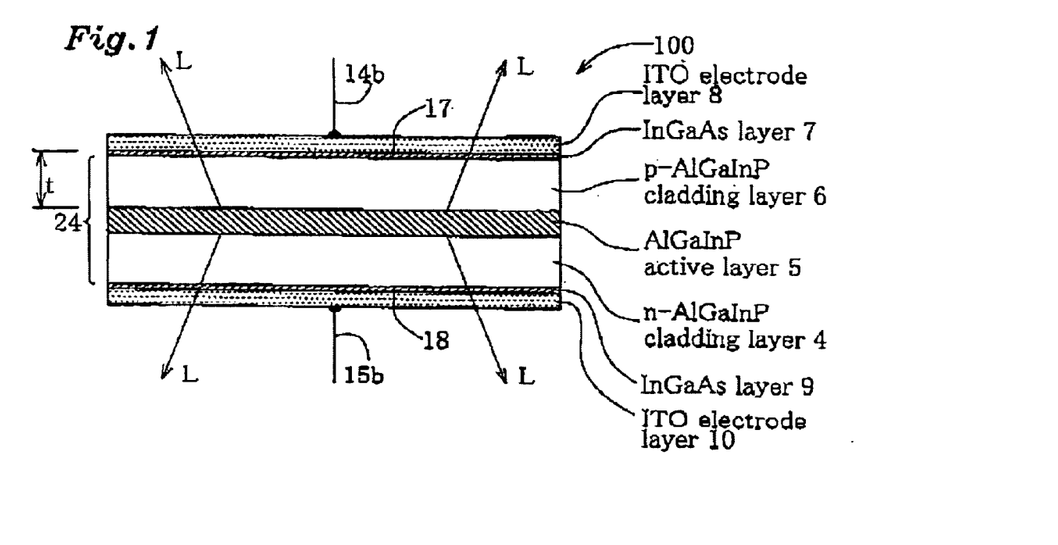
FIG. 1 is a model diagram showing an example of a light emitting device of the present invention in a stacked structure.

FIG. 1 is a model diagram showing a light emitting device 100, which is an embodiment of the present invention. The light emitting device 100 has a structure in which an InGaAs layer 7 as an electrode contact layer and an ITO electrode layer 8 as an oxide transparent electrode layer are formed in the order in a first major surface 17 side of a light emitting layer section 24. In a second major surface 18 side of the light emitting layer section 24, an InGaAs layer 9 as an electrode contact layer and an ITO electrode layer 10 as an oxide transparent electrode layer are formed in the order. The ITO electrode layers 8 and 10 together with the InGaAs layer 7 and the InGaAs layer 9 are formed on the respective both major surfaces 17 and 18 of the light emitting layer section 24 so as to cover the respective both major surfaces 17 and 18 in the entirety thereof.

The light emitting layer section 24 are made of $(Al_xGa_{1-x})_yIn_{1-y}P$ alloy and has a double hetero-structure constituted of a first conductivity type cladding layer 6; a second conductivity type cladding layer 4 and an active layer 5 inserted between the first conductivity type cladding layer 6 and the second conductivity cladding layer 4. The structure is, to be concrete, such that an active layer 5 made of a non-doped $(Al_xGa_{1-x})_yIn_{1-y}P$, wherein $0 \leq x \leq 0.55$, $0.45 \leq y \leq 0.55$, is sandwiched by a p type $(Al_xGa_{1-x})_yIn_{1-y}P$ cladding layer 6 and an n type $(Al_xGa_{1-x})_yIn_{1-y}P$ cladding layer 4. In the light emitting device 100 of FIG. 1, the p-type AlGaInP cladding layer 6 is disposed in the ITO electrode layer 8 side and the n type AlGaInP cladding layer 4 is disposed in the ITO electrode layer 10 side. Therefore, a current polarity is positive at the ITO electrode layer 8 side. Note that, though self-explanatory to a person skilled in the art, the "non-doped" means "not to add a dopant intentionally", which categorically does not excludes a content of a dopant component unavoidably mixed into a product in an ordinary manufacturing process (for example, the upper limit of non-doping is the order of a value in the range of from $10^{13}$ to $10^{16}$ atoms/cm$^3$).

Note that in the light emitting device 100 of FIG. 1, thickness values of layers can be exemplified as follows:

InGaAs layer 7 with a thickness of about 0.005 μm;

ITO electrode layer 8 with a thickness of 0.2 μm and having a tin oxide content of 7 mass % (the balance being indium oxide);

p type AlGaInP cladding layer 6 with a thickness of 1 μm;

AlGaInP active layer 5 with a thickness of 0.6 μm;

n type AlGaInP cladding layer 4 with a thickness of 1 μm;

InGaAs layer 9 with a thickness of about 0.005 μm; and

ITO electrode layer 10 having the same construction as ITO electrode layer 8.

Description will be given of a manufacturing method for the light emitting device 100 of FIG. 1.

Figure 3:
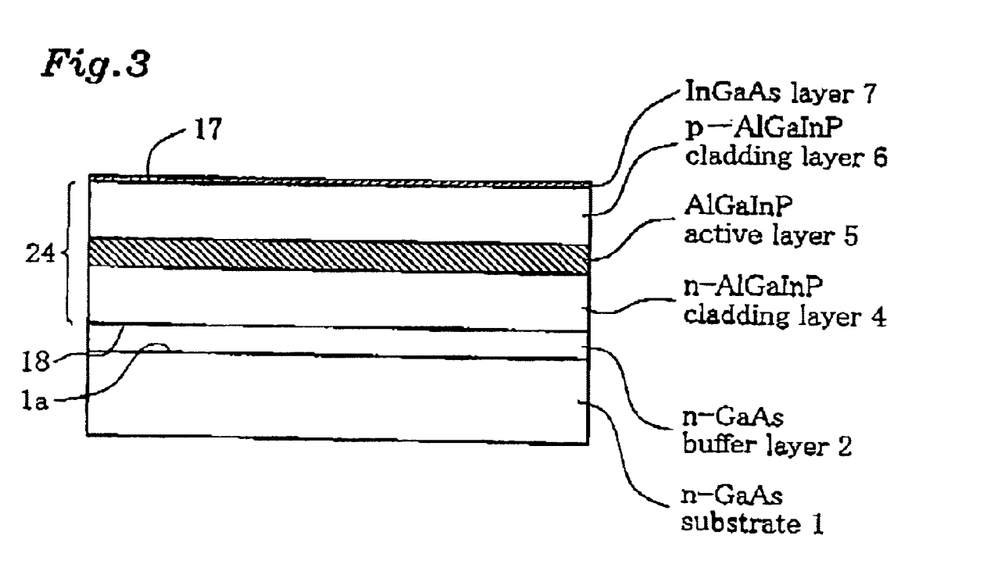
FIG. 3 is a model diagram showing a manufacturing process of the light emitting device of FIG. 1.

At first, as shown in FIG. 3, the following layers with respective thickness values are epitaxially grown in the order on the first major surface 1a of a GaAs single crystal substrate 1, which is a compound semiconductor single crystal substrate lattice matched with an AlGaInP alloy: the n type GaAs buffer layer 2 with a thickness of, for example, 0.5 μm, and as the light emitting layer section 24 the n type AlGaInP cladding layer 4 with a thickness of 1 μm, the AlGaInP active layer (non-doped) 5 with a thickness of 0.6 μm, the p type AlGaInP cladding layer 6 with a thickness of 1 μm, and further the InGaAs layer 7 with a thickness of 0.005 μm. Epitaxial growth of each layer can be performed by means of a known metalorganic vapor phase epitaxy (MOVPE) method.

Figure 4A:
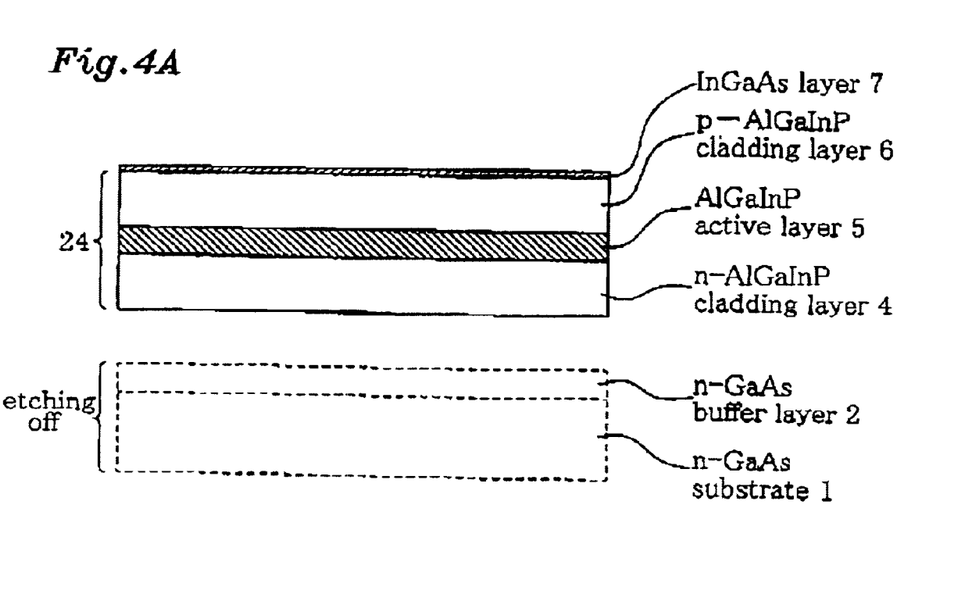
FIG. 4A is a model diagram showing the manufacturing process subsequent to FIG. 3.
Figure 4B:
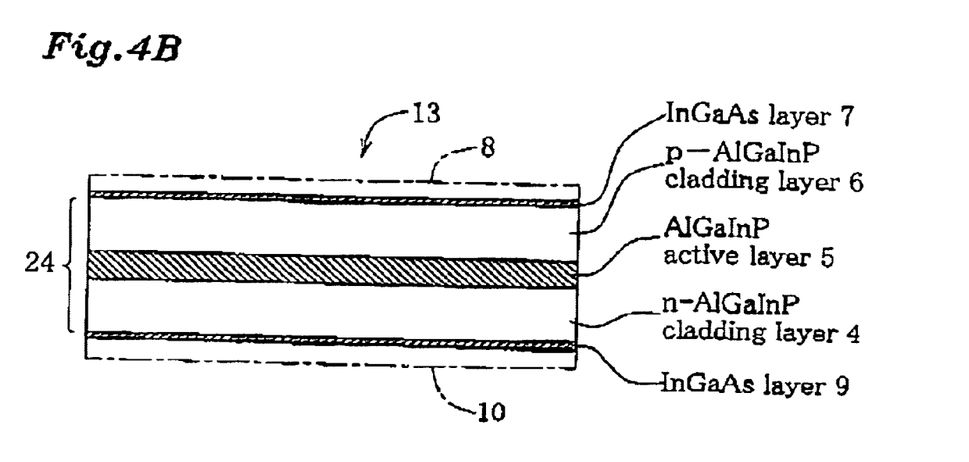
FIG. 4B is a model diagram showing the manufacturing process subsequent to FIG. 4A.

After the above growth, the epitaxially grown intermediate is immersed in an etching liquid made of, for example, a sulfuric acid-base aqueous solution (composed of conc. sulfuric acid:30% hydrogen peroxide:water=2:1:1 in vol. ratio); thereby enabling removing off of the GaAs substrate 1 and the GaAs buffer layer 2 (FIG. 4A). Then, as shown in FIG. 4B, in the side removed by the etching, the InGaAs layer 9 is epitaxially grown on the major surface 18 of the n type AlGaInP cladding layer 4 to a thickness of 0.005 μm by means of a MOVPE method.

The ITO electrode layers 8 and 10 are then formed to a thickness value of 0.2 μm on both of the major surfaces of the InGaAs layer 7 and the InGaAs layer 9, respectively, by means of a radio frequency sputtering method in which, as conditions, a target composition is of 90.2 wt% of $In_2O_3$ and 9.8 wt % of $SnO_2$, an rf frequency is 13.56 MHz, an Ar pressure is 0.6 Pa and a sputtering power output is 30 W, thereby obtaining a stacked wafer 13. Note that after formation of the films, the stacked wafer is heat treated at a temperature in the range of from 300° C. to 500° C. in a nitrogen atmosphere; thereby enabling reduction in a resistivity by about one order of magnitude. The stacked wafer 13 is divided by dicing into semiconductor chips, a semiconductor chip is fixed on a supporter, lead wires 14b and 15b are thereafter attached as shown in FIG. 1 and a resin encapsulated portion not shown is further formed; thereby obtaining the light emitting device 100.

According to the above light emitting device 100, all the surfaces of the p type AlGaInP cladding layer 6 and the n type AlGaInP cladding layer 4 are covered by the respective ITO electrode layers 8 and 10 with the InGaAs layer 7 and the InGaAs layer 9 interposed therebetween, wherein a drive voltage is applied to the light emitting device 100 via the ITO electrodes 8 and 10. Since a drive current under a drive voltage diffuses laterally in the ITO electrode layers 8 and 10 with a good conductivity in a uniform manner over all the surfaces thereof, not only is uniform luminance obtained over the entire light extraction surfaces (both major surfaces 17 and 18), but a light extraction efficiency is improved because of transparency of the electrode layers 8 and 10. Furthermore, since the ITO electrode layer 8 and 10 each form an ohmic contact with the InGaAs layer 7 and the InGaAs layer 9, respectively, each having a comparatively narrow bandgap, a series resistance at a contact section is restricted low, thereby raising a luminous efficiency by a great margin.

Furthermore, since no necessity arises for a thick current spreading layer as was required in a prior art light emitting device, a distance between an ITO electrode layer (oxide transparent electrode layer) and a light emitting plane can be greatly reduced. As a result, a series resistance can be lowered. Note that the light emitting plane is defined in the following way. At first, in a case where a light emitting layer section 24 has a double hetero-structure as described above, the light emitting plane is a cladding layer/an active layer interface in the side nearer the oxide transparent electrode layer in consideration (ITO electrode layer); that is when viewed from the ITO electrode layer 8, an interface between the p type cladding layer 6 and the active layer 5, while when viewed from the ITO electrode layer 10, an interface between the n type cladding layer 4 and the active layer 5. On the other hand, the present invention is not limited to a light emitting device having a light emitting layer section of a double hetero-structure as described above, but can be applied to a light emitting device having a light emitting layer section of a single hetero-structure, and in this case, a hetero junction interface is defined as a light emitting plane. By adopting the present invention, a distance t from an interface between an oxide transparent electrode layer and an electrode contact layer to a light emitting plane (see FIG. 1) can be a small value of 3 μm or less, to be concrete.

While the InGaAs layer 7 or the InGaAs layer 9, which are electrode contact layers, may be made of the same conductivity type as that of the cladding layer 6 or 4 in contact with them by adding a proper dopant, in a case where the InGaAs layer 7 or the InGaAs layer 9 is formed as a thin layer as described above, the lowly doped layers each with a low dopant concentration (for example, $10^{17}$ atoms/cm$^3$ or less) or each as a non-doped layer ($10^{13}$ atoms/cm$^3$ to $10^{16}$ atoms/cm$^3$) can be adopted without a problem since no excessive increase in series resistance. In a case of a low doped layer adopted, an effect as described below can be achieved according to a drive voltage of a light emitting device. That is, since, when an electrode contact layer is low doped, an electric resistivity itself of the layer increases, an electric field applied in the direction of the layer thickness direction in the electrode contact layer (that is a voltage per a unit distance) is higher as compared with the cladding layer or the ITO layer with a smaller electric resistivity, both being sandwiched together with the electrode contact layer. At this time, when the electrode contact layer is made of InGeAs with a comparatively small bandgap, a proper modification arises in a band structure of the electrode contact layer by application of the above electric field, thereby, enabling formation of better ohmic contact.

Figure 8:
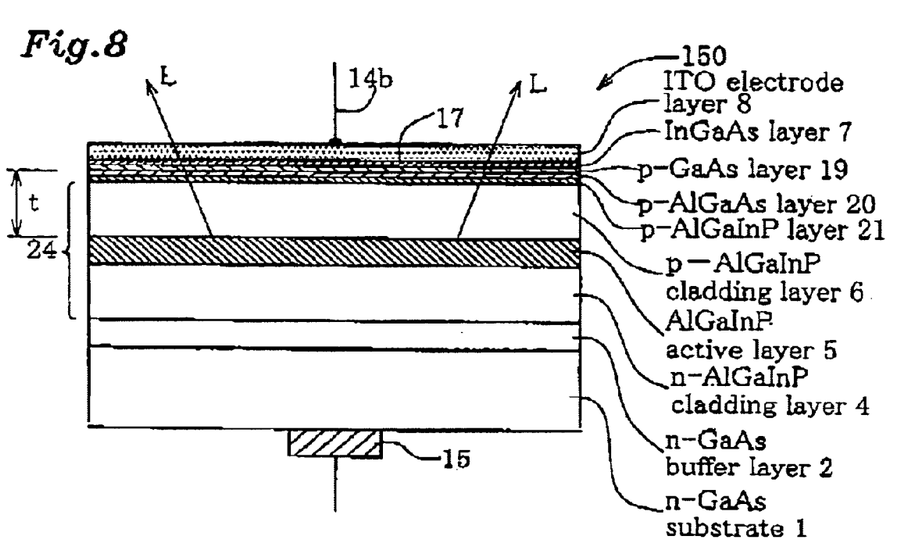
FIG. 8 is a model diagram showing an example of an device structure having an intermediate layer formed between an electrode contact layer and a cladding layer.

Note that in a case where the InGaAs layer and the AlGaInP layer are directly contacted with each other, a slightly higher hetero-barrier arises at a junction interface and there can be a case where a series resistance increases owing to the hetero-junction barrier. Therefore, for the purpose to reduce the increase in the series resistance, like a light emitting device 150 shown in FIG. 8, an intermediate layer composed of a GaAs layer 19, an AlGaAs layer 20, an AlGaInP layer 21 and others can be inserted as occasion arises between the InGaAs electrode contact layer 7 in contact with the oxide transparent electrode (ITO electrode layer) 8 and the AlGaInP cladding layer 6. Even in a case where this structure is adopted, since thickness values of constituent layers of the intermediate layer can be set to be on the order of 0.1 µm or less each, an epitaxial growth time is reduced due to thinning of a film, in turn, productivity can be improved and increase in the series resistance due to a formed intermediate layer can also be reduced; therefore, a luminous efficiency is hard to be lost.

Figure 5:
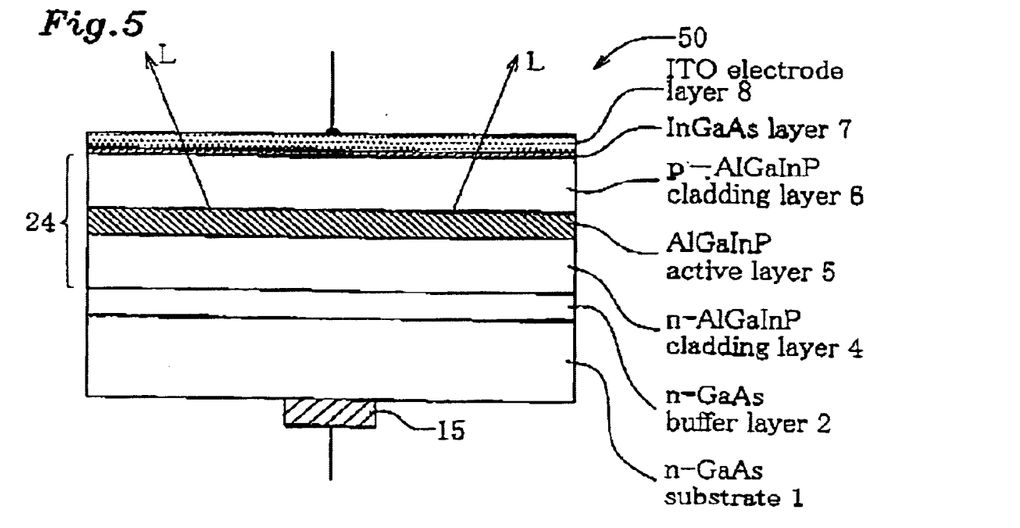
FIG. 5 is a model diagram showing an example of device structure in which an electrode contact layer and an oxide transparent electrode layer are formed on only first major surface of a light emitting layer section.
Figure 6:
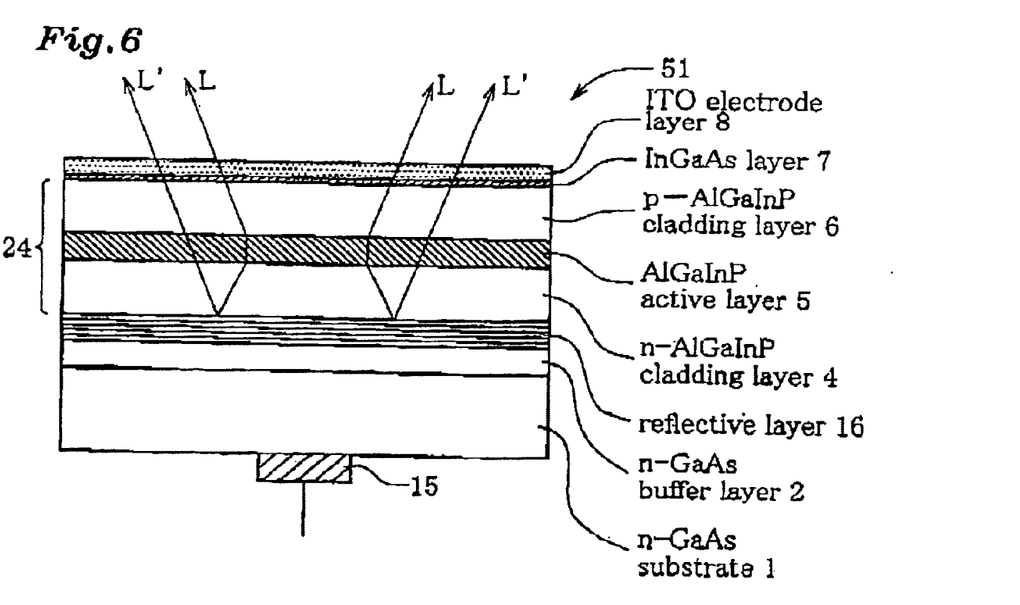
FIG. 6 is a model diagram showing an example of device structure having a reflective layer inserted in a second major surface side of a light extraction layer section.

Note that, like the light emitting device 50 shown in FIG. 5, an electrode contact layer (for example, an InGaAs layer) and an oxide transparent electrode layer (ITO electrode layer) may be contacted to only one side of the light emitting layer section 24 made of a double hetero-structure. In this case, the n type GaAs substrate 1 is adopted as a device substrate and the InGaAs layer 7 and the ITO electrode layer 8 are formed on the first major surface side. Furthermore, like a light emitting device 51 shown in FIG. 6, a semiconductor multilayer film disclosed in, for example, JP A 95-66455 or a metal layer made of Au or Au alloy can be inserted as a reflective layer 16 between the GaAs substrate 1 and the light emitting layer section 24. With this structure adopted, an reflective light L' on the reflective layer 16 is added to light L going directly through the light extraction layer side from the light emitting layer section 24, thereby, enabling enhancement of a light extraction efficiency. Furthermore, for the purpose to further reduce total reflection loss, an interface between a light emitting layer section and a light extraction layer can also be concave toward the light extraction direction, as disclosed in JP A 93-190893.

Figure 2:
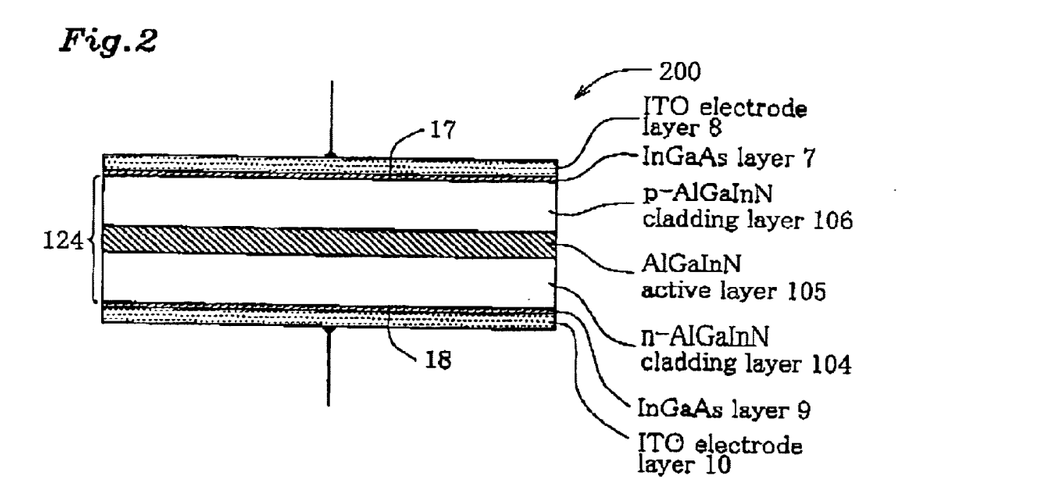
FIG. 2 is a model diagram showing another example of the light emitting device of the present invention in a stacked structure.

While, in the light emitting device 100 shown in FIG. 1, constituent layers of the light emitting layer section 24 of a double hetero-structure are made of AlGaInP alloy, a blue or ultraviolet wide-gap type light emitting device 200 shown in FIG. 2 can also be formed by forming the constituent layers (including the p type cladding layer 106, the active layer 105 and the n type cladding layer 104) of the light emitting layer section 124 of a double hetero-structure using AlGaInN alloy. The light emitting layer section 124 is formed by means of a MOVPE method like the light emitting device 100 of FIG. 1. Since the light emitting device 200 of FIG. 2 is of the same construction as the light emitting device 100 of FIG. 1 except for the light emitting layer section 124, detailed description of the rest is omitted.

Figure 10A:
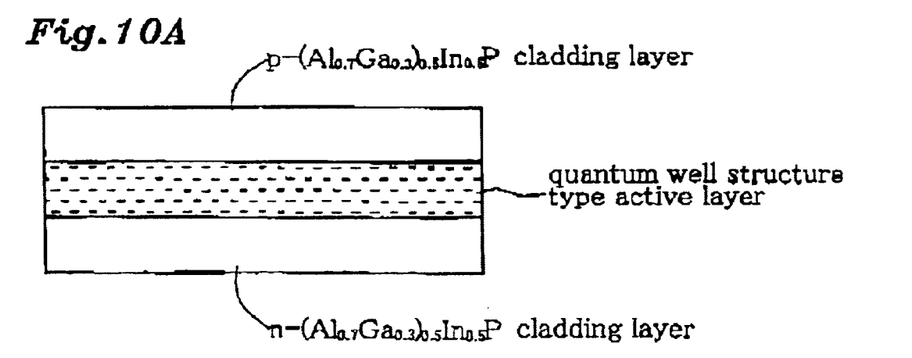
FIG. 10A is a model diagram of an active layer having a quantum well structure.
Figure 10B:
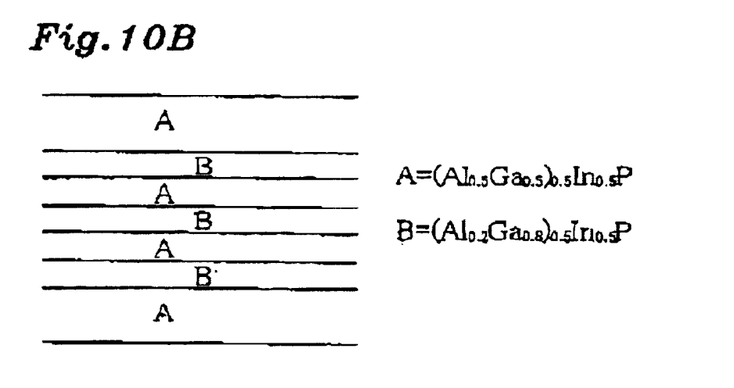
FIG. 10B is a model diagram showing a multiple quantum well structure.
Figure 10C:
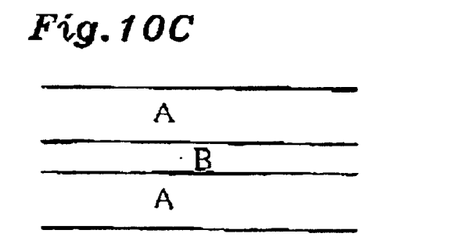
FIG. 10C is a model diagram showing a single quantum well structure.

While the active layer 5 or 105 is formed as a single layer in the above embodiment, it can also be formed as plural stacked compound semiconductor layers having different bandgap energy values, that is to be concrete, as a quantum well structure as shown in FIG. 10A. An active layer having a quantum well structure, as shown in FIGS. 10B and 10C, is formed in a process in which two layers each having a bandgap different from the other owing to adjustment in alloy composition, that is a well layer B with a small bandgap energy and a barrier layer A with a large bandgap energy, are alternately stacked in lattice matching, controlling so that each layer has a thickness of a mean free path of an electron or less (generally, in the range of from one atomic layer to several tens of Å). In the above structure, since energy of an electron (or a hole) in the well B is quantized, an oscillating wavelength can be freely adjusted according to a width and depth of an energy well layer when the structure is applied to, for example, a semiconductor laser and good effects are exerted on stabilization of an oscillating wavelength, improvement on a luminous efficiency, furthermore, reduction in oscillation threshold current density and others. Moreover, since thickness values of the well layer B and the barrier layer A are very small, there is allowed a shift of up to a value of the order of 2 to 3% in lattice constant therebetween, also facilitating expansion of an oscillating wavelength region. Note that a quantum well structure may be either a structure of multiple quantum wells having plural well layers B as shown in FIG. 10B or a structure of a single quantum well having only one well layer B as sown in FIG. 10C. In FIG. 10A, p type and n type cladding layers are made of $(Al_{0.7}Ga_{0.3})_{0.5}In_{0.5}P$ alloy, the barrier layer A is made of an $(Al_{0.5}Ga_{0.5})_{0.5}In_{0.5}P$ alloy and the well layer B is made of an $(Al_{0.2}Ga_{0.8})_{0.5}In_{0.5}P$ alloy. Note that a thickness of only a barrier layer A in contact with a cladding layer can be, for example, on the order of 500 Å and the other scan be on the order of 60 Å. Furthermore, a thickness of a well layer B can be on the order of 50 Å.

While, in the above description, the best mode for carrying out the present invention is shown, the present invention is not limited to the description, but various kinds of improvements or modifications may be incorporated thereinto as far as not departing from bounds defined by the terms of claims. For example, while, in the above embodiments, a light emitting layer section is made of AlGaInP alloy or AlGaInN alloy, the section may be made of another compound semiconductor such as GaP, GaAsP, AlGaAs or the like and in this case as well, the effect of the present invention described above can also be achieved.

What is claimed is:

1. A light emitting device comprising: a light emitting layer section made of compound semiconductor layers; and an oxide transparent electrode layer for applying an emission drive voltage to the light emitting layer section, wherein light from the light emitting layer section is extracted in a way to be transmitted through the oxide transparent electrode layer, wherein an electrode contact: layer made of $In_xGa_{1-x}As$ ($0<x\leq1$) is formed between the light emitting layer section and the oxide transparent electrode layer so as to be in contact with the oxide transparent electrode layer;

wherein a thickness of the electrode contact layer made of $In_xGa_{1-x}As$ is adjusted in the range of from 0.001 to 0.02 µm.

2. The light emitting device according to claim 1, wherein the oxide transparent electrode layer is formed so as to cover all the surface of the light emitting layer section.

3. The light emitting device according to claim 1, wherein the light emitting layer section is made of $(Al_xGa_{1-x})_yIn_{1-y}P$, wherein $0 \leq x \leq 1$, $0 \leq y \leq 1$, or $In_xGa_yAl_{1-x-y}N$, wherein $0 \leq x \leq 1$, $0 \leq y \leq 1$ and $x+y \leq 1$.

4. The light emitting device according to claim 1, wherein the light emitting layer section has a double hetero-structure obtained by stacking a first conductivity type cladding layer, an active layer and a second conductivity type cladding layer in the order, made of $(Al_xGa_{1-x})_yIn_{1-y}P$ or $In_xGa_yAl_{1-x-y}N$ and the electrode contact layer is formed between at least one of the first conductivity type cladding layer and the second conductivity type cladding layer and the oxide transparent electrode layer so as to be in contact with the oxide transparent electrode layer.

5. The light emitting device according to claim 3, wherein the light emitting layer section has a double hetero-structure obtained by stacking a first conductivity type cladding layer, an active layer and a second conductivity type cladding layer in the order, made of $(Al_xGa_{1-x})_yIn_{1-y}P$ or $In_xGa_yAl_{1-x-y}N$ and the electrode contact layer is formed between at least one of the first conductivity type cladding layer and the second conductivity type cladding layer and the oxide transparent electrode layer so as to be in contact with the oxide transparent electrode layer.

6. The light emitting device according to claim 4, wherein the active layer is made of $(Al_xGa_{1-x})_yIn_{1-y}P$, wherein $0 \leq x \leq 0.55$, $0.45 \leq y \leq 0.55$.

7. The light emitting device according to claim 5, wherein the active layer is made of $(Al_xGa_{1-x})_yIn_{1-y}P$, wherein $0 \leq x \leq 0.55$, $0.45 \leq y \leq 0.55$.

8. The light emitting device according to claim 4, wherein the active layer has a quantum well structure including plural stacked compound semiconductor layers having different bandgap energy values.

9. The light emitting device according to claim 5, wherein the active layer has a quantum well structure including plural stacked compound semiconductor layers having different bandgap energy values.

10. The light emitting device according to claim 6, wherein the active layer has a quantum well structure including plural stacked compound semiconductor layers having different bandgap energy values.

11. The light emitting device according to claim 7, wherein the active layer has a quantum well structure including plural stacked compound semiconductor layers having different bandgap energy values.

12. The light emitting device according to claim 1, wherein the oxide transparent electrode layer is an ITO electrode layer.

13. The light emitting device according to claim 2, wherein the oxide transparent electrode layer is an ITO electrode layer.

14. The light emitting device according to claim 1, wherein the oxide transparent electrode layer is a ZnO electrode layer.

15. The light emitting device according to claim 2, wherein the oxide transparent electrode layer is a ZnO electrode layer.

* * * * *

UNITED STATES PATENT AND TRADEMARK OFFICE
CERTIFICATE OF CORRECTION

PATENT NO. : 6,847,056 B2
DATED : January 25, 2005
INVENTOR(S) : Nobuhiko Noto et al.

It is certified that error appears in the above-identified patent and that said Letters Patent is hereby corrected as shown below:

Column 10,
Line 63, delete "contact:" and substitute therefore -- contact --

Signed and Sealed this

Twenty-eighth Day of June, 2005

JON W. DUDAS
*Director of the United States Patent and Trademark Office*